US011456662B2

(12) United States Patent
Xing et al.

(10) Patent No.: US 11,456,662 B2
(45) Date of Patent: Sep. 27, 2022

(54) ZERO-CROSSING DETECTION DEVICE AND METHOD THEREOF AND NO-NEUTRAL SWITCH

(71) Applicant: SAVANT TECHNOLOGIES LLC, East Cleveland, OH (US)

(72) Inventors: Dong Xing, Shanghai (CN); Weihu Chen, Shanghai (CN); JinPeng Hu, Shanghai (CN); Aijun Wang, Shanghai (CN); Fanbin Wang, Shanghai (CN)

(73) Assignee: SAVANT TECHNOLOGIES LLC, East Cleveland, OH (US)

( * ) Notice: Subject to any disclaimer, the term of this patent is extended or adjusted under 35 U.S.C. 154(b) by 0 days.

(21) Appl. No.: 17/067,637

(22) Filed: Oct. 9, 2020

(65) Prior Publication Data
US 2021/0135565 A1   May 6, 2021

(30) Foreign Application Priority Data
Oct. 31, 2019 (CN) .......................... 201911052078.7

(51) Int. Cl.
*H02M 3/04* (2006.01)
*H03K 5/24* (2006.01)

(52) U.S. Cl.
CPC ................ *H02M 3/04* (2013.01); *H03K 5/24* (2013.01)

(58) Field of Classification Search
None
See application file for complete search history.

(56) References Cited

U.S. PATENT DOCUMENTS

| | | | |
|---|---|---|---|
| 7,619,365 B2* | 11/2009 | Davis .................... | H02M 5/293 315/112 |
| 8,350,487 B2* | 1/2013 | Thirugnanasambandham ............ | H03K 17/133 315/209 R |
| 8,664,889 B2* | 3/2014 | Newman, Jr. .......... | H05B 39/04 315/291 |
| 10,028,347 B2* | 7/2018 | Vanderzon ........... | H03K 3/2897 |
| 10,845,397 B2* | 11/2020 | Bruhn, Jr. .............. | G01R 19/02 |

* cited by examiner

*Primary Examiner* — Jeffery S Zweizig
(74) *Attorney, Agent, or Firm* — Wood IP LLC

(57) ABSTRACT

Provided are a zero-crossing detection device and a method thereof, a no-neutral switch, a storage medium and a processor. The no-neutral switch may include a switch element, the switch element has a first end connected to a power supply and a second end connected to a load, and the zero-crossing detection device may include: a sampling module configured to sample a first signal of the first end of the switch element and a second signal of the second end of the switch element; a comparison module configured to compare a deviation of the first signal and the second signal with a preset threshold; and a computing module configured to compute a zero-crossing point of the power supply according to a comparison result of the comparison module and the preset threshold.

17 Claims, 4 Drawing Sheets

ZERO-CROSSING DETECTION DEVICE AND METHOD THEREOF AND NO-NEUTRAL SWITCH

CROSS-REFERENCE TO RELATED APPLICATION

This application claims priority to and the benefit of Chinese Patent Application No. 201911052078.7, filed on Oct. 31, 2019, the entire contents of which are incorporated herein by reference.

TECHNICAL FIELD

The disclosure relates to a zero-crossing detection device for a no-neutral switch, a method of detecting a zero-crossing point of a power supply for the no-neutral switch, a no-neutral switch, a storage medium and a processor.

BACKGROUND

Along with development of science and technology and improvement of a living standard, a consumer puts forward a new requirement on use of household. For example, as for an electric appliance with illumination function, the consumer not only requests that illumination time and brightness of an illumination device can be conveniently controlled, but requests that the illumination device can cooperate with other household systems, to meet requirements of the consumer on an illumination scene in different life situations. The consumer may need an intelligent on-off control system to improve living quality, and hope to ensure convenience and comfort of living.

In this regard, a traditional switch may have a significant defect, and may not have remote control function and not meet an illumination requirement of the consumer in the different scenes. By contrast, an electronic switch has a broad application prospect. On one hand, because it is convenient and simple to mount and replace the electronic switch, the electronic switch may be configured to directly replace a traditional wall switch widely used in traditional household. On the other hand, as an alternative, the electronic switch may be configured to conveniently achieve remote control or intelligent control, for example, a ZigBee intelligent switch in the intelligent household may have wireless remote control and touch sensing functions. For example, the electronic switch may be configured to dynamically adjust the illumination intensity of the illumination device. When adjusting power output to the illumination device, a zero-crossing point of a power supply needs to be detected, to provide an exact conduction angle for achievement of phase cut dimming. However, in a conventional art, a single line wire dimmer for adjusting the illumination intensity of the illumination device is serially connected with the power supply and a load, and no complete alternating current signal may be detected on the dimmer, therefore it is difficult to find the zero-crossing point.

SUMMARY

The disclosure provides a zero-crossing detection device for a no-neutral switch, wherein the no-neutral switch may include a switch element, the switch element has a first end connected to a power supply and a second end connected to a load. Herein, the zero-crossing detection device may include: a sampling module configured to sample a first signal of the first end of the switch element and a second signal of the second end of the switch element; a comparison module configured to compare a deviation of the first signal and the second signal with a preset threshold; and a computing module configured to compute a zero-crossing point of the power supply according to a comparison result of the comparison module and the preset threshold. The zero-crossing detection device according to the disclosure may be applicable to different types of loads (such as an LED) with a small number of components and may provide the exact zero-crossing point, without being influenced by an alternating current frequency. Furthermore, under a situation that a complete alternating current voltage signal may not be acquired, the zero-crossing device may find the zero-crossing point of a power signal, in this way an exact adjusting basis may be provided to a power adjusting device of the load.

According to a preferred embodiment of the zero-crossing detection device of the disclosure, the comparison module is further configured to send a triggering signal to the computing module when the deviation exceeds the preset threshold, and the computing module is further configured to compute the zero-crossing point according to time of the triggering signal and time delay of the triggering signal relative to the zero-crossing point. Under a situation that the first signal and the second signal of both ends of the switch element are acquired, one of the signals is taken as a reference signal, in this way the zero-crossing point of the power signal is calculated according to the preset threshold.

According to a preferred embodiment of the zero-crossing detection device of the disclosure, the computing module is further configured to compute the time delay according to frequency of the power supply and the preset threshold. The computing module may compute time that a change of the power signal exceeds the preset threshold within each half alternating current period, and the time may be considered as the time delay relative to the zero-crossing point.

According to a preferred embodiment of the zero-crossing detection device of the disclosure, the computing module is further configured to compute the frequency of the power supply according to an interval between at least two adjacent triggering signals. Under a situation that the frequency of the power supply is unknown, the frequency of the power supply may be computed by detecting the interval between the triggering signals in multiple signal periods.

According to a preferred embodiment of the zero-crossing detection device of the disclosure, the computing module is further configured to set the frequency of the power supply to a default value. During computation, the frequency of the power supply may be set to the default value of 50 Hz or 60 Hz according to a regulation on electricity consumption of a geographic region where the zero-crossing detection device is positioned.

According to a preferred embodiment of the zero-crossing detection device of the disclosure, the comparison module may include an operational amplifier configured to compare the deviation of the first signal and the second signal with the preset threshold. The operational amplifier may send an indicator signal on an output end upon detecting that the deviation exceeds the preset threshold, as to indicate the time that the deviation exceeds the preset threshold.

According to a preferred embodiment of the zero-crossing detection device of the disclosure, the first signal and the second signal are voltage signals. Through detecting the voltage signals, the zero-crossing point of an alternating current voltage signal of an alternating current power supply may be conveniently detected.

According to a preferred embodiment of the zero-crossing detection device of the disclosure, the computing module is further configured to have wireless communication function. Therefore, the computing module may be controlled in a wireless mode, or the computing module may provide information concerning zero-crossing detection or phase cut dimming in the wireless mode.

The disclosure further provides a no-neutral switch arranged between a power supply and a load, wherein the no-neutral switch may include: the zero-crossing detection device described above; and a switch element connected with the zero-crossing detection device. Herein, the switch element is configured to adjust power provided to the load from the power supply according to a zero-crossing point. The no-neutral switch according to the disclosure may provide the load with an exact power adjustment according to the exact zero-crossing point under a situation that a complete alternating current voltage signal may not be acquired.

According to a preferred embodiment of the no-neutral switch of the disclosure, the no-neutral switch may further include: a power converter configured to convert a voltage from a power supply to a power voltage provided to a computing module of the zero-crossing detection device. The power converter may provide the zero-crossing detection device with needed electric energy after conversion.

According to a preferred embodiment of the no-neutral switch of the disclosure, the switch element is a bidirectional thyristor. The bidirectional thyristor is also called a triode for alternating current (TRIAC) dimmer, as an alternating current switching device, to achieve alternating current voltage regulation, light dimming and other functions.

The disclosure further provides a method of detecting a zero-crossing point of a power supply for a no-neutral switch, wherein the no-neutral switch may include a switch element, and the switch element has a first end connected to the power supply and a second end connected to a load. Herein, the method may include: a first signal of the first end of the switch element and a second signal of the second end of the switch element are sampled; a deviation of the first signal and the second signal is compared with a preset threshold; and the zero-crossing point of the power supply is computed according to a comparison result and the preset threshold. Under a situation that a complete alternating current voltage signal may not be acquired, the method of the disclosure may find the zero-crossing point of a power signal, in this way an exact adjusting basis may be provided to a power adjusting device of the load.

According to a preferred embodiment of the method of the disclosure, the step that the deviation of the first signal and the second signal is compared with the preset threshold may include: when the deviation exceeds the preset threshold, a triggering signal is sent. Furthermore, the step that the zero-crossing point of the power supply is computed may include: the zero-crossing point is computed according to time of the triggering signal and time delay of the triggering signal relative to the zero-crossing point. Under a situation that the first signal and the second signal of both ends of the switch element are acquired, one of the signals is taken as a reference signal, in this way the zero-crossing point of the power supply is calculated according to the preset threshold.

According to a preferred embodiment of the method of the disclosure, the step that the zero-crossing point of the power supply is computed may further include: the time delay is computed according to the frequency of the power supply and the preset threshold. Accordingly, the method may compute time that a change of the power signal exceeds the preset threshold within each half alternating current period, and the time may be considered as the time delay relative to the zero-crossing point.

According to a preferred embodiment of the method of the disclosure, the step that the zero-crossing point of the power supply is computed may further include: the frequency of the power supply is computed according to an interval between at least two adjacent triggering signals. Under a situation that the frequency of the power signal is unknown, the method of the disclosure may compute the frequency of the power supply through detecting the interval between the triggering signals in multiple signal periods.

According to a preferred embodiment of the method of the disclosure, the step that the zero-crossing point of the power supply is computed may further include: the frequency of the power supply is set to a default value. During computation, the method of the disclosure may set the frequency of the power supply to the default value of 50 Hz or 60 Hz according to a regulation on electricity consumption of a geographic region where the method is implemented.

According to another aspect of the disclosure, the disclosure further provides a storage medium, and the storage medium may include a stored program, wherein a device where the storage medium is positioned is controlled to implement the method described above when the program runs.

According to another aspect of the disclosure, the disclosure further provides a processor, and the processor is configured to execute a program, wherein the method described above is implemented when the program is executed.

BRIEF DESCRIPTION OF THE DRAWINGS

The accompanying drawings described herein are used to facilitate a further understanding of the disclosure, and constitute a part of the description. These drawings diagrammatize the embodiment of the disclosure, and are used to explain the principle of the disclosure with the description. An identical reference number is used to show an identical component in the drawings. In the drawings.

DETAILED DESCRIPTION OF THE EMBODIMENTS

In order to make the solutions of the disclosure better understood by those skilled in the art, the technical solutions in the embodiments of the disclosure will be clearly and completely described below in combination with the drawings in the embodiments of the disclosure. It is apparent that the described embodiments are not all embodiments but part of embodiments of the disclosure. All other embodiments obtained by those of ordinary skill in the art on the basis of the embodiments in the disclosure without creative work shall fall within the scope of protection of the disclosure.

It should be noted that terms "first", "second", etc. in the description, claims and the foregoing accompany drawings of the disclosure are used for distinguishing similar objects rather than describing a specific sequence or a precedence order. It will be appreciated that the terms used in such a way may be exchanged under appropriate conditions, in order that the embodiments of the disclosure described here can be implemented in a sequence other than sequences graphically shown or described here. In addition, terms "include" and "have" and any variations thereof are intended to cover non-exclusive inclusions. For example, it is not limited for processes, methods, systems, products or devices containing a series of steps or units to clearly list those steps or units, and other steps or units which are not clearly listed or are inherent to these processes, methods, products or devices may be included instead.

Figure 1:
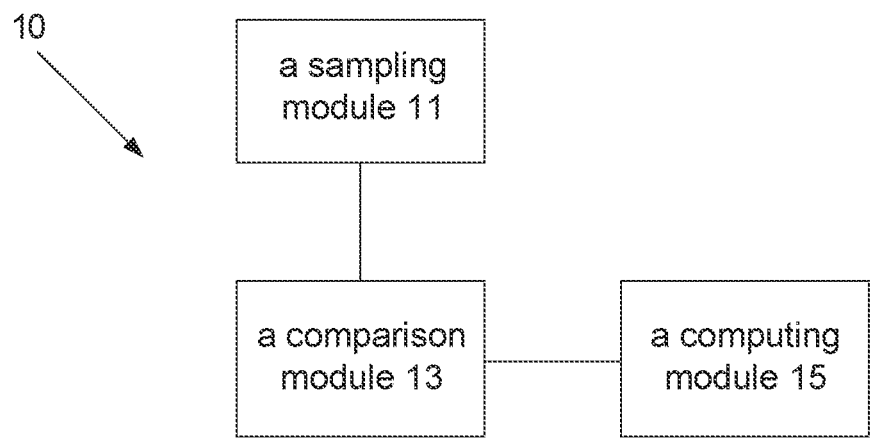
FIG. 1 shows a structure diagram of a zero-crossing detection device according to an embodiment of the disclosure.

FIG. 1 shows a structure diagram of a zero-crossing detection device 10 according to an embodiment of the disclosure. In the embodiment shown in FIG. 1, the zero-crossing detection device 10 may include a sampling module 11 configured to sample a first signal of a first end and a second signal of a second end of a switch element included by a no-neutral switch; a comparison module 13 configured to compare a deviation of the first signal and the second signal with a preset threshold; and a computing module 15 configured to compute a zero-crossing point of a power supply according to a comparison result of the comparison module 13 and the preset threshold.

Figure 2:
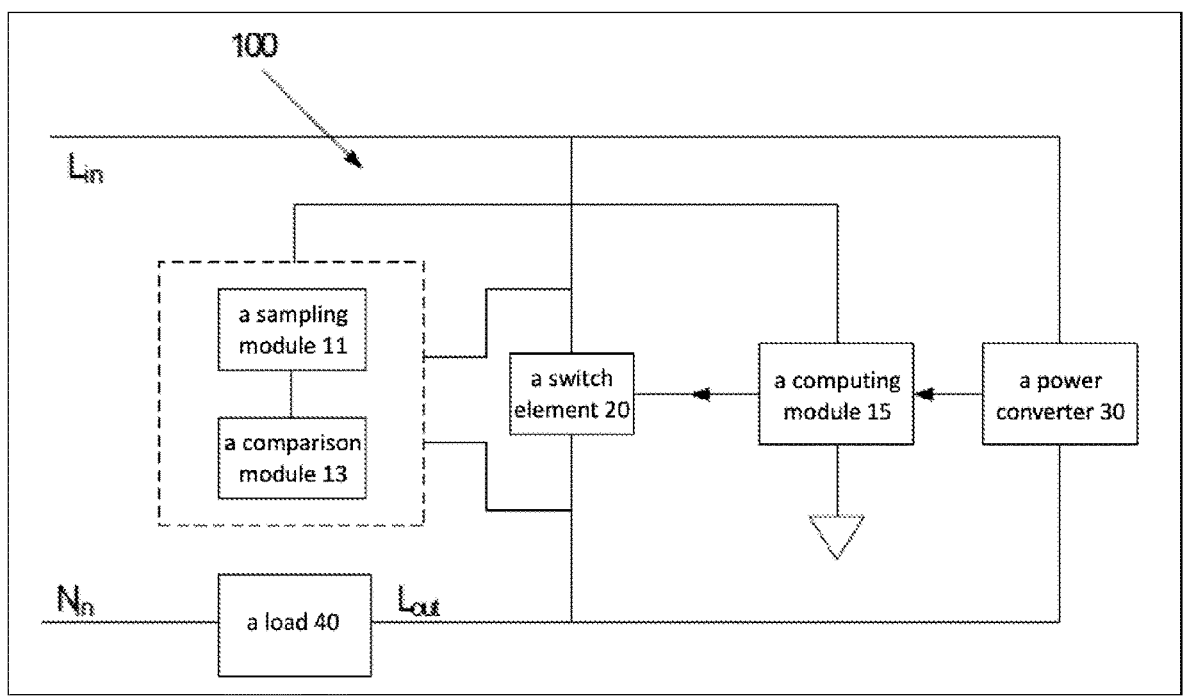
FIG. 2 shows a structure diagram of a no-neutral switch of a zero-crossing detection device according to an embodiment of the disclosure.

FIG. 2 shows a structure diagram of a no-neutral switch 100 of a zero-crossing detection device according to an embodiment of the disclosure. In the embodiment shown in FIG. 2, the no-neutral switch 100 is connected between a line wire input end Lin of a power supply and a load 40 serially, and the load 40 is connected between a line wire output end Lout and a null wire Nin. In the embodiment, the load 40 is implemented as an illumination device. In other embodiments not shown, the load 40 may be implemented as other electrical devices. The no-neutral switch 100 may include a zero-cross detection device 10 shown in FIG. 1 which includes a sampling module 11, a comparison module 13 and a computing module 15. For example, the computing module 15 has a storage medium which stores a preset threshold value required by computation of a zero-crossing point and other default values. In addition, the no-neutral switch 100 may further include a switch element 20 implemented as the TRIAC and connected to an output end of the computing module 15; and a power converter 30 configured to convert a voltage from the power supply to a power supply voltage provided to the computing module 15 of the zero-crossing detection device. As shown in FIG. 2, the sampling module 11 and the comparison module 13 of the zero-crossing detection device are connected with both ends of the switch element 20 in parallel. In the embodiment, the computing module 15 of the zero-crossing detection device may be implemented as a wireless controller having wireless communication function, wherein the wireless controller may, for example, be implemented as a Micro Controller Unit (MCU) or a similar control unit. The switch element 20 may implement phase cutting for an alternating current voltage of the power supply according to the zero-crossing point provided by the computing module 15, as to adjust power output to the load 40. Under a situation that the load 40 is implemented as the illumination device, the switch element 20 may implement exact phase cut dimming for an illumination load according to the zero-crossing point.

Figure 3:
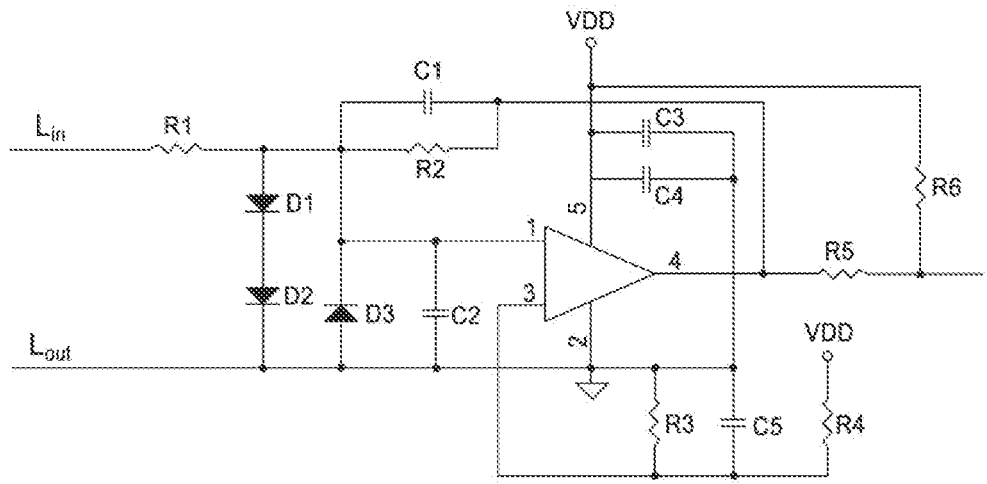
FIG. 3 shows a circuit diagram of a zero-crossing detection device according to an embodiment of the disclosure, and a sampling module and a comparison module are shown.

FIG. 3 shows a circuit diagram of a zero-crossing detection device according to an embodiment of the disclosure, and a sampling module and a comparison module are shown. The comparison module of the zero-crossing detection device may include an operational amplifier indicated by a triangle device and configured to compare a deviation of a first signal and a second signal of both ends of a switch element of a no-neutral switch with a preset threshold and output time delay relative to a zero-crossing point according to a comparison result. An electronic device is configured between the operational amplifier, a line wire input end Lin and a line wire output end Lout, thereby constituting the sampling module of the zero-crossing device. A voltage of the line wire input end Lin is input to a pin 1 of the operational amplifier after division of voltage by a first resistor R1 and a second resistor R2. The line wire output end Lout is connected to a node between a pin 2 of the operational amplifier and the ground. The line wire input end Lin is connected to a node between the line wire output end Lout and the pin 2 through a first diode D1 and a second diode D2. The line wire input end Lin is connected to the node between the pin 2 and the ground through parallel connection of a third diode D3 and a second capacitor C2. Furthermore, the line wire input end Lin is connected to a pin 4 of the operational amplifier through parallel connection of a first capacitor C1 and the second resistor R2. A power supply end VDD is connected to a pin 3 of the operational amplifier through a fourth resistor R4 and connected to the node between the pin 2 and the ground respectively through a third resistor R3 and a fifth capacitor C5 connected in parallel. Another power supply end VDD is connected to a pin 5 of the operational amplifier, and connected to the fifth capacitor C5 through a third capacitor C3 and a fourth capacitor C4 connected in parallel. The pin 4 of the operational amplifier outputs the comparison result through a fifth resistor R5, namely, a triggering signal when the deviation of the signals of a first end and a second end of the switch element exceeds the preset threshold. Another power supply end VDD is connected to the fifth resistor R5 through a resistor R6.

Figure 4:
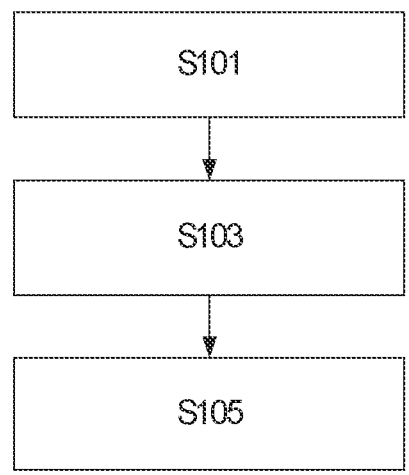
FIG. 4 shows a flow diagram of a method of detecting a zero-crossing point of a power supply for a no-neutral switch according to an embodiment of the disclosure.

FIG. 4 shows a flow diagram of a method of detecting a zero-crossing point of a power supply for a no-neutral switch according to an embodiment of the disclosure. In the embodiment, the no-neutral switch may include a switch element, and the detection method according to the embodiment of the disclosure may include the following steps.

Step S101, a first signal of a first end of the switch element and a second signal of a second end of the switch element are sampled, wherein the sampled signals are voltage signals.

Step S103, a deviation of the first signal and the second signal is compared with a preset threshold, wherein one of the first signal and the second signal is taken as a reference signal, and a comparison result indicates time that a change of a power signal exceeds the preset threshold within each half alternating current period.

Step S105, the zero-crossing point of the power supply is computed according to the comparison result and the preset threshold.

Figure 5:
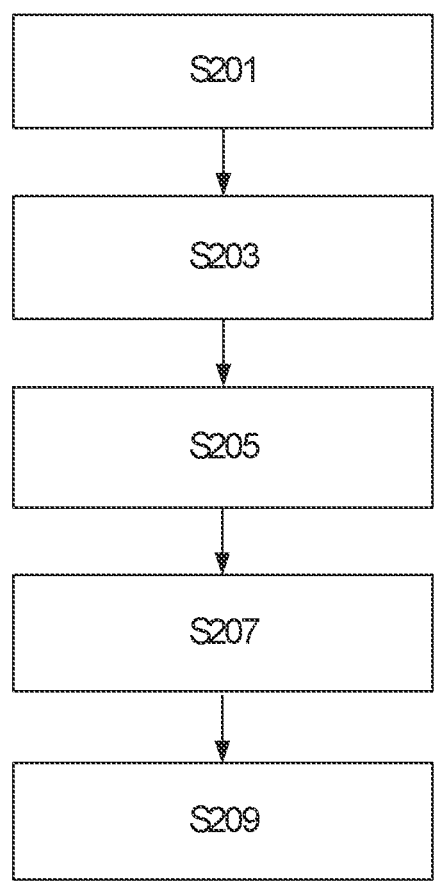
FIG. 5 shows a flow diagram of a method of detecting a zero-crossing point of a power supply for a no-neutral switch according to an exemplary embodiment of the disclosure.

FIG. 5 shows a flow diagram of a method of detecting a zero-crossing point of a power supply for a no-neutral switch according to an exemplary embodiment of the disclosure. In the exemplary embodiment, the no-neutral switch may include a switch element, and the detection method may include the following steps.

Step S201, a first signal of a first end of the switch element and a second signal of a second end of the switch element are sampled.

Step S203, a triggering signal is sent when a deviation of the sampled first signal and the sampled second signal exceeds a preset threshold.

Step S205, frequency of a power supply is computed according to an interval between at least two adjacent triggering signals, or the frequency of the power supply is set to a default value according to a geographic region wherein the method is implemented, for example, 50 Hz or 60 Hz.

Step S207, time delay of the triggering signal relative to the zero-crossing point is computed according to the frequency of the power supply and the preset threshold, wherein the time delay $\Delta t$ may be computed according to the following formula: $\Delta t = \sin^{-1} a/A/2\pi f$, where a is a predetermined voltage threshold, A is a peak of an alternating current voltage (set to a fixed default value, for example, 120V), and f is the frequency of a voltage signal of the power supply.

Step S209, the zero-crossing point of the power supply is computed according to time of the triggering signal and the time delay of the triggering signal relative to the zero-crossing point, wherein the zero-crossing point t is computed by: $t = t_{trigger} - \Delta t$, where $t_{trigger}$ is the time of triggering the signal, and $\Delta t$ is the time delay computed in Step S207.

The above are only the preferred embodiments of the disclosure and are not intended to limit the disclosure. For those skilled in the art, the disclosure may have various modifications and variations. Any modifications, equivalent replacements, improvements and the like made within the spirit and principle of the disclosure shall fall within the scope of protection of the disclosure.

What is claimed is:

1. A zero-crossing detection device for a no-neutral switch, wherein the no-neutral switch comprises a switch element, the switch element has a first end connected to a power supply and a second end connected to a load, wherein the zero-crossing detection device comprises:
   a computing module;
   a sampling module configured to sample a first signal of the first end of the switch element and a second signal of the second end of the switch element; and
   a comparison module configured to compare a deviation of the first signal and the second signal with a preset threshold and to send a triggering signal to the computing module when the deviation exceeds the preset threshold;
   wherein the computing module is configured to compute a zero-crossing point of the power supply according to time of the triggering signal and time delay of the triggering signal relative to the zero-crossing point according to frequency of the power supply and the preset threshold.

2. The detection device of claim 1, wherein the computing module is further configured to compute the frequency of the power supply according to an interval between at least two adjacent triggering signals.

3. The detection device of claim 1, wherein the computing module is further configured to set the frequency of the power supply to a default value.

4. The detection device of claim 1, wherein the comparison module comprises an operational amplifier configured to compare the deviation of the first signal and the second signal with the preset threshold.

5. The detection device of claim 1, wherein the first signal and the second signal are voltage signals.

6. The detection device of claim 1, wherein the computing module is further configured to have wireless communication function.

7. The detection device of claim 1, wherein the switch element is configured to adjust power provided to the load from the power supply according to the zero-crossing point provided by the zero-crossing detection device.

8. The detection device of claim 1, further comprising a power converter configured to convert a voltage from the power supply to a power voltage provided to the computing module of the zero-crossing detection device.

9. The detection device of claim 1, wherein the switch element is a bidirectional thyristor.

10. A no-neutral switch, comprising:
    a zero-crossing detection device; and
    a switch element connected with the zero-crossing detection device, having a first end connected to a power supply and a second end connected to a load, configured to adjust power provided to the load from the power supply according to the zero-crossing point provided by the zero-crossing detection device;
    wherein the zero-crossing detection device comprises:
      a computing module;
      a sampling module configured to sample a first signal of the first end of the switch element and a second signal of the second end of the switch element; and
      a comparison module configured to compare a deviation of the first signal and the second signal with a preset threshold and to send a triggering signal to the computing module when the deviation exceeds the preset threshold;
      wherein the computing module is configured to compute a zero-crossing point of the power supply according to time of the triggering signal and time delay of the triggering signal relative to the zero-crossing point according to frequency of the power supply and the preset threshold.

11. The no-neutral switch of claim 10, further comprising a power converter configured to convert a voltage from the power supply to a power voltage provided to the computing module of the zero-crossing detection device.

12. The no-neutral switch of claim 10, wherein the switch element is a bidirectional thyristor.

13. A method of detecting a zero-crossing point of a power supply for a no-neutral switch, wherein the no-neutral switch comprises a switch element, the switch element has a first end connected to the power supply and a second end connected to a load, wherein the method comprises:
    sampling a first signal of the first end of the switch element and a second signal of the second end of the switch element;
    comparing a deviation of the first signal and the second signal with a preset threshold that comprises when the deviation exceeds the preset threshold, sending a triggering signal; and
    computing the zero-crossing point of the power supply according to time of the triggering signal and time delay of the triggering signal relative to the zero-crossing point and computing the time delay according to frequency of the power supply and the preset threshold.

14. The method of claim 13, wherein computing the zero-crossing point of the power supply further comprises:

computing the frequency of the power supply according to an interval between at least two adjacent triggering signals.

15. The method of claim 13, wherein computing the zero-crossing point of the power supply further comprises: setting the frequency of the power supply to a default value.

16. A storage medium, wherein the storage medium comprises a stored program, wherein a device where the storage medium is positioned is controlled to implement the method of claim 13 when the program runs.

17. A processor, wherein the processor is applied to execute a program, wherein the method of claim 13 is implemented when the program is executed.

* * * * *